(12) United States Patent
Guguen et al.

(10) Patent No.: US 7,377,990 B2
(45) Date of Patent: May 27, 2008

(54) PROCESS FOR SECURING A MICROWAVE MODULE TO A SUPPORT

(75) Inventors: Charline Guguen, Rennes (FR); Gérard Haquet, Chateaubourg (FR); Corinne Nicolas, La Chapelle des Fougeretz (FR)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 10/433,547

(22) PCT Filed: Nov. 14, 2001

(86) PCT No.: PCT/EP01/13165

§ 371 (c)(1),
(2), (4) Date: Oct. 24, 2003

(87) PCT Pub. No.: WO02/49139

PCT Pub. Date: Jun. 20, 2002

(65) Prior Publication Data

US 2004/0055703 A1    Mar. 25, 2004

(30) Foreign Application Priority Data

Dec. 15, 2000 (FR) .................................. 00 16412

(51) Int. Cl.
*B32B 7/14* (2006.01)

(52) U.S. Cl. .................................. 156/291; 156/307.3
(58) Field of Classification Search .................. 156/71, 156/277, 290, 291, 307.1, 307.3, 307.7; 343/700 MS, 343/729, 767, 770, 795, 797; 332/149, 163
See application file for complete search history.

(56) References Cited

U.S. PATENT DOCUMENTS

| | | | |
|---|---|---|---|
| 4,242,157 A | 12/1980 | Gehle | 156/64 |
| 4,616,413 A | 10/1986 | Iliou et al. | 29/832 |
| 5,049,434 A * | 9/1991 | Wasulko | 428/202 |
| 5,840,417 A * | 11/1998 | Bolger | 428/323 |

OTHER PUBLICATIONS

Search Report dated Feb. 26, 2002.

* cited by examiner

*Primary Examiner*—Philip Tucker
*Assistant Examiner*—Sing Chan
(74) *Attorney, Agent, or Firm*—Joseph J. Laks; Robert D. Shedd; Brian J. Cromarty

(57) ABSTRACT

The present invention relates to a process for securing to a metal support at least one microwave electronic module made on a substrate one of whose faces forms an earth plane. The process consists in depositing between the face forming the earth plane and the metal support, at least one strip of conducting adhesive at the level of the zones of breakage of the earth plane. The invention applies to the microwave field.

7 Claims, 1 Drawing Sheet

PROCESS FOR SECURING A MICROWAVE MODULE TO A SUPPORT

This application claims the benefit, under 35 U.S.C. §365 of International Application PCT/EP01/13165, filed Nov. 14, 2001, which was published in accordance with PCT Article 21(2) on Jun. 20, 2002 in English and which claims the benefit of French patent application No. 0016412, filed Dec. 15, 2000.

The present invention relates to a process for securing to a metal support at least one microwave electronic module made or a substrate one of whose faces forms an earth plane.

BACKGROUND OF THE INVENTION

In the field of microwaves, the Fabrication of circuits carrying out electronic functions such as mixers, amplifiers or others, may be carried out on substrates of various kinds by using etched lines. The making of a microwave subassembly consists in putting several functions in series or in parallel, these functions being linked together by interconnection systems such as etched lines or wiring tracks. In general, several functions are carried out on one and the same substrate by using printed circuit type technology which has been matched to the materials and to the specific thicknesses for microwave applications. Thus, as represented schematically in FIG. 1, a microwave electronic module can consist of an etched circuit 1 made on a substrate 2 of a material such as "Teflon" glass, namely "Teflon" woven with glass fibres. This substrate, generally not very rigid and exhibiting a relatively small thickness with respect to its other dimensions, is coated on its lower face with a metal earth plane 3. These electronic modules are usually mounted on a metal package or support 4. Various types of assembly are therefore used to secure the substrate 2 to the metal package or support 4. However, the use of electronic circuits at near-millimetre frequencies, in particular at frequencies of several gigahertz, demands good electrical contact between the earth plane 3 of the substrate 2 situated on the lower face of the substrate and the metal earth of the support 4. To address this constraint, various methods can be used to assemble the substrate onto the metal package or support. Thus, it is possible to use a screwing process which has the advantage of being very simple, easily automated and inexpensive. However, this process is not applicable to millimetre frequencies, since the thickness of the substrate 2 is very slender with respect to these other dimensions, this possibly giving rise to problems of deformation of the circuits etched and/or mounted on the substrate possibly inducing cracks in the solder joints. Moreover, the contact between the earth plane of the substrate and the earth plane of the metal support is very localized. The other technique widely used in the field of microwaves is a bonding technique which makes it possible to obtain reliable transfer having good electrical characteristics. Several methods of bonding exist for assembling two materials. Thus, mention may be made of the use of a film which makes it possible to achieve assembly of very high reliability, although its material cost is relatively high and it is complex to implement since it requires the application of pressure throughout the adhesive curing cycle. Another technique consists in employing one- or two-component conducting epoxy adhesives, the conducting particles usually consisting of silver or gold. In this case, the adhesive is deposited using, for example, a syringe. Whereas this technique is less expensive than the previous one, it requires good control of the adhesive so as to deposit a layer which is quasi-uniform in terms of thickness and surface. According to another embodiment, the epoxy adhesive may be deposited by screen printing, thereby making it possible to obtain a uniform layer in terms of thickness and surface. This technique also has the advantage of being fast but uses a considerable quantity of adhesive.

In the field of microwaves, one of the abovementioned bonding techniques is used by spreading the paste over the entire surface of the circuit to be bonded so as to obtain good earth transfer, the adhesives being laden with conducting particles of the silver or gold type. The above technique has the drawback of being especially expensive owing to the appreciable quantity of adhesive required. The applicant, during studies carried out on the bonding of substrate comprising at least one microwave electronic module on a metal package or support, has noticed, contrary to the given teachings, that it was not necessary to deposit the adhesive on the entire surface of the substrate. The adhesive can be deposited at specific sites making it possible to avoid non-conductivity of the signal without giving rise to problems in the operation of the electronic module.

SUMMARY OF THE INVENTION

Consequently, the subject of the present invention is a process for securing to a metal support at least one microwave electronic module made on a substrate one of whose face forms an earth plane, characterized in that it consists in depositing between the face forming the earth plane and the metal support, at least one strip of conducting adhesive at the level of the zones of breakage of the earth plane. These breakage zones appear most frequently at transitions. The role of the transition is to allow the signal to switch from one mode of propagation to another (e.g.: from the TE10 mode of the rectangular guide to the quasi TEM mode of the microstrip line) while guaranteeing good matching of the assembly and minimum losses for the signal crossing the transition. If earth continuity is not ensured between the two modes of propagation:

mismatches appear resulting in a loss of energy of the signal by reflection, a part of the signal may propagate outside the transition and disturb other elements of the circuit.

The use of the above method makes it possible to minimize the quantity of adhesive deposited on the substrate and, consequently, the cost of the process.

Furthermore, to ensure effective bonding of the assembly with better resistance of the circuit to environmental constraints (temperature variations, humidity factor, thermal expansion), according to another characteristic of the present invention, additional strips of conductive adhesive forming a mechanical reinforcement are deposited.

BRIEF DESCRIPTION OF THE DRAWINGS

Other characteristics and advantages of the present invention will become apparent on reading the description given hereinbelow of a preferred embodiment, this description being given with reference to the appended drawings in which.

DESCRIPTION OF PREFERRED EMBODIMENTS

To simplify the description, in the figures the same elements bear the same references.

Figure 1:
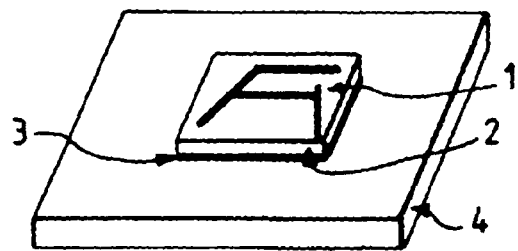
FIG. 1, already described, is a schematic perspective view of a microwave electronic module bonded to a support to which the present invention is applied.
Figure 2:
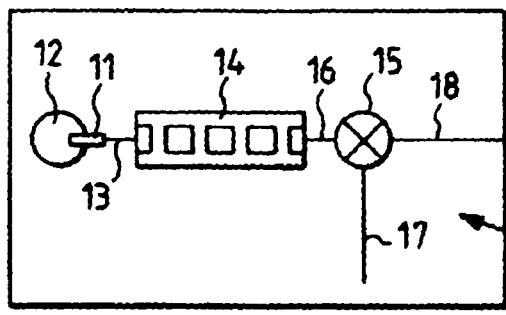
FIG. 2 is a plan view from above of a millimetre receiver made on a substrate which will be bonded in accordance with the present invention.

The application of the present invention to the case of a 40 GHz millimetre receiver will be described with reference to FIGS. 2, 3 and 4. As represented in FIG. 2, on a substrate 10 which may be made in a known manner from "Teflon" glass, has firstly been made a transition 11 between a circular guide 12 and a microstrip line 13 for the reception of the millimetre signal, namely the 40 GHz signal. The circuit also comprises a bandpass filter 14 receiving as input the millimetre signal transported by the microstrip line 13. The bandpass filter 14 is made in suspended microstrip line technology, its purpose being to filter the useful signal and to reject the image frequency and the leaks of the local oscillator. Mounted at the output of the bandpass filter 14 is a mixer 15 connected to the filter by a microstrip line 16. Moreover, a local oscillator (not represented) is connected to the mixer 15 by a microstrip line 17, this involving at the end of the microstrip line 17 away from the mixer a microstrip line/coaxial line transition dependent on the embodiment of the local oscillator. As represented in FIG. 2, the output of the mixer is linked to the output of the entire receiver block by a microstrip line 18, this also giving rise in this case to a microstrip line/coaxial line transition.

Figure 3:
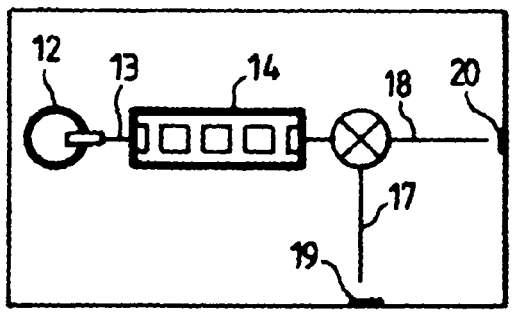
FIG. 3 is a view corresponding to that of FIG. 1 showing the necessary bonding zones.
Figure 4:
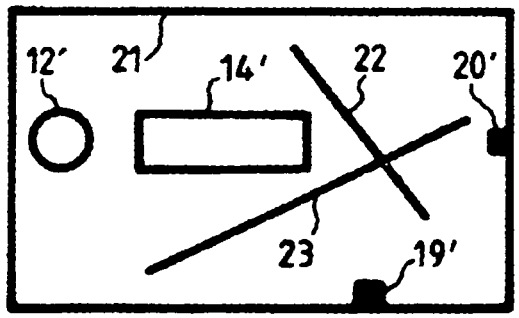
FIG. 4 is a plan view from below of the circuit of FIG. 1 showing the location of the various bonding zones.

With the circuit of FIG. 2 and as represented in FIG. 3, perfect earth continuity must be obtained between the various modes of propagation. The zones where this earth continuity must be obtained have been represented by a thick line. This involves in particular the output of the circular wave guide 12, the perimeter of the bandpass filter 14 and the transitions 19 and 20 respectively between the local oscillator (not represented) and the microstrip line 17 for connection to the mixer and between the output of the receiver block and the microstrip line 18 for connection to the output of the mixer.

In accordance with the present invention and taking into account the abovementioned problems of earth continuity, to avoid any break in the earth plane, the Teflon glass substrate 10 is bonded to a metal support (not represented) by depositing strips of adhesive, only in the zones represented by thick lines, namely the zones 12', 14', 19' and 20'.

In accordance with an additional characteristic of the present invention, to ensure better resistance to the constraints, strips of adhesive are also applied as mechanical reinforcement, namely the strips 21, 22 and 23.

In accordance with the present invention, the strips of adhesive consist of a conducting epoxy adhesive which may be a one- or two-component adhesive such as the adhesives sold by the company Epo-Tek under the reference H20E, this type being given merely by way of example. These adhesives are laden with particles of silver or gold which provide them with their conductivity. Moreover, in accordance with the present invention, the adhesive is deposited preferably; using screen printing deposition. However, it is obvious to the person skilled in the art that other types of deposition, in particular deposition by syringe or any similar deposition used in the technology of epoxy adhesives may be employed.

The invention claimed is:

1. Process for securing to a metal support at least one microwave electronic module made on a substrate one of whose faces forms an earth plane, comprising a step of depositing one strip of conducting adhesive between the face forming the earth plane and the metal support only at a level of zones of breakage of the earth plane, to obtain earth continuity, said zones of breakage being at points of transition between a first mode of propagation and a second different mode of propagation, the other parts of the earth plane being formed without adhesive deposited thereon.

2. Process according to claim 1, characterized in that the conducting adhesive is a one- or two-component conducting epoxy adhesive.

3. Process according to claim 2, characterized in that the conducting adhesive is laden with conducting particles such as silver or gold.

4. Process according to claim 1, wherein the conducting adhesive is deposited by using screen-printing deposition or deposition by syringe.

5. Process for securing to a metal support at least one microwave electronic module made on a substrate one of whose faces forms an earth plane, comprising a step of depositing one piece of a strip of conductive adhesive between the face forming the earth plane and the metal support at a level of zones of breakage of the earth plane to obtain earth continuity, said zones of breakage being at points of transition between a first mode of propagation and a second different mode of propagation, wherein additional pieces of the strip of conducting adhesive forming a mechanical reinforcement are deposited between the face forming the earth plane and the metal support, the other parts of the earth plane being formed without adhesive deposited thereon.

6. Process according to claim 5, wherein the additional pieces of the strip of conducting adhesive forming a mechanical reinforcement are deposited around the perimeter of the face of the module forming the earth plane.

7. Process according to claim 5, characterized in that the conducting adhesive is a one- or two-component conducting epoxy adhesive.

* * * * *